(12) United States Patent
Khandekar et al.

(10) Patent No.: US 9,472,451 B2
(45) Date of Patent: Oct. 18, 2016

(54) TECHNIQUE FOR WAFER-LEVEL PROCESSING OF QFN PACKAGES

(71) Applicant: Maxim Integrated Products, Inc., San Jose, CA (US)

(72) Inventors: Viren Khandekar, Flower Mound, TX (US); Karthik Thambidurai, Plano, TX (US); Ahmad Ashrafzadeh, Morgan Hill, CA (US); Amit S. Kelkar, Flower Mound, TX (US); Hien D. Nguyen, The Colony, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/512,506

(22) Filed: Oct. 13, 2014

(65) Prior Publication Data
US 2015/0028475 A1 Jan. 29, 2015

Related U.S. Application Data

(63) Continuation of application No. 13/690,634, filed on Nov. 30, 2012, now Pat. No. 8,860,222.

(60) Provisional application No. 61/580,478, filed on Dec. 27, 2011.

(51) Int. Cl.
*H01L 23/48* (2006.01)
*H01L 23/52* (2006.01)
(Continued)

(52) U.S. Cl.
CPC ......... *H01L 21/76877* (2013.01); *H01L 21/56* (2013.01); *H01L 23/28* (2013.01); *H01L 23/29* (2013.01); *H01L 23/3114* (2013.01); *H01L 23/481* (2013.01); *H01L 23/50* (2013.01); *H01L 24/03* (2013.01); *H01L 24/05* (2013.01); *H01L 24/06* (2013.01); *H01L 24/11* (2013.01); *H01L 24/14* (2013.01); *H01L 24/17* (2013.01); *H01L 25/0657* (2013.01); *H01L 21/561* (2013.01); *H01L 24/13* (2013.01); *H01L 24/16* (2013.01); *H01L 2224/02379* (2013.01);
(Continued)

(58) Field of Classification Search
CPC . H01L 23/488; H01L 23/498; H01L 23/528; H01L 23/5389
USPC ......................................... 257/758, 698, 772
See application file for complete search history.

(56) References Cited

U.S. PATENT DOCUMENTS

2003/0045023 A1 3/2003 Jeon
2004/0070064 A1 4/2004 Yamane et al.
(Continued)

OTHER PUBLICATIONS

Jonathan Harris; Semiconductor Wafer Backside Metallization: Die Attach for High Thermal Demand Applications; CMC Interconnect Technologies; pp. 1-55.
(Continued)

*Primary Examiner* — Hoai V Pham
(74) *Attorney, Agent, or Firm* — Advent, LLP

(57) ABSTRACT

Semiconductor package device, such as wafer-level package semiconductor devices, are described that have pillars for providing electrical interconnectivity. In an implementation, the wafer-level package devices include an integrated circuit chip having at least one pillar formed over the integrated circuit chip. The pillar is configured to provide electrical interconnectivity with the integrated circuit chip. The wafer-level package device also includes an encapsulation structure configured to support the pillar.

7 Claims, 6 Drawing Sheets

(51) Int. Cl.
*H01L 21/768* (2006.01)
*H01L 23/29* (2006.01)
*H01L 21/56* (2006.01)
*H01L 23/50* (2006.01)
*H01L 23/31* (2006.01)
*H01L 23/00* (2006.01)
*H01L 25/065* (2006.01)
*H01L 23/28* (2006.01)

(52) U.S. Cl.
CPC ......... *H01L 2224/0348* (2013.01); *H01L 2224/0391* (2013.01); *H01L 2224/03462* (2013.01); *H01L 2224/03903* (2013.01); *H01L 2224/0401* (2013.01); *H01L 2224/05008* (2013.01); *H01L 2224/05541* (2013.01); *H01L 2224/05569* (2013.01); *H01L 2224/05571* (2013.01); *H01L 2224/05647* (2013.01); *H01L 2224/0603* (2013.01); *H01L 2224/11422* (2013.01); *H01L 2224/13111* (2013.01); *H01L 2224/16145* (2013.01); *H01L 2224/94* (2013.01); *H01L 2225/06513* (2013.01); *H01L 2225/06548* (2013.01); *H01L 2924/00014* (2013.01); *H01L 2924/014* (2013.01); *H01L 2924/01029* (2013.01)

(56) References Cited

U.S. PATENT DOCUMENTS

| | | |
|---|---|---|
| 2004/0219717 A1 | 11/2004 | Takahashi et al. |
| 2008/0265434 A1 | 10/2008 | Kurita |
| 2008/0303167 A1 | 12/2008 | Wang et al. |
| 2009/0032971 A1* | 2/2009 | Chan ............... H01L 24/11 257/777 |
| 2010/0320599 A1 | 12/2010 | Chan et al. |

OTHER PUBLICATIONS

Valery V. Felmetsger; High-adhesive back side metallization of ultrathin wafers; J. Vac. Sci. Technol.; May 17, 2007; vol. 25, No. 3; pp. 881-885; American Vacuum Society, San Jose, CA.

* cited by examiner

TECHNIQUE FOR WAFER-LEVEL PROCESSING OF QFN PACKAGES

CROSS-REFERENCE TO RELATED APPLICATIONS

The present application is a continuation under 35 U.S.C. §120 of U.S. patent application Ser. No. 13/690,634, filed Nov. 30, 2012, entitled "TECHNIQUES FOR WAFER-LEVEL PROCESSING OF QFN PACKAGES," which is hereby incorporated by reference in its entirety.

BACKGROUND

Flat no-lead packaging technologies, such as quad-flat no-leads (QFN) packaging technologies, physically and electrically connect integrated circuit chips to printed circuit boards. Flat no-lead packaging technologies typically employ a lead-frame that includes an integrated circuit chip (die) mounted thereon. The die may be electrically interconnected with the lead-frame through wire-bonding technology or flip-chip technology. An encapsulation structure is then formed over the lead-frame to encapsulate the integrated circuit chip.

SUMMARY

Techniques are described for fabricating wafer-level package semiconductor devices that have form factors similar to those of devices that employ flat no-lead (e.g., QFN) packaging technologies. In one or more implementations, the wafer-level package devices include an integrated circuit chip (e.g., die) having at least one pillar (e.g., a copper pillar) formed over the integrated circuit chip. The pillar is configured to provide electrical interconnectivity to the integrated circuit chip. An encapsulation structure configured to support the pillar is formed over the surface of the integrated circuit chip. In one or more implementations, a second integrated circuit device may be mounted to the integrated circuit chip so that the integrated circuit device is in electrical communication with the integrated circuit chip. The second integrated circuit device is at least partially encapsulated by the encapsulation structure.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
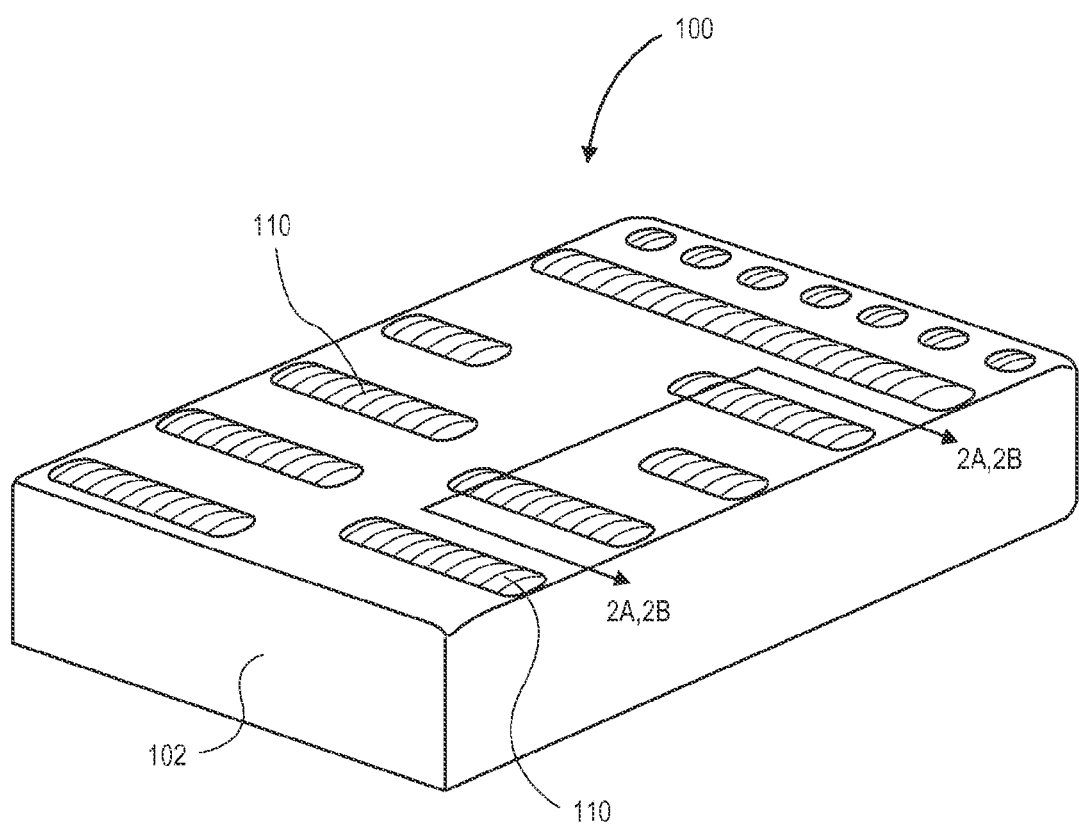
FIG. 1 is a diagrammatic perspective elevation view illustrating a wafer-level package device in accordance with an example implementation of the present disclosure.

Devices that employ flat no-lead packaging technologies, such as QFN packaging technologies, provide good mechanical protection to the integrated circuit chips (dies) contained within the device packages by fully encapsulating the integrated circuit chips within the package. However, flat no-lead (e.g., QFN) package devices are expensive to produce and typically provide relatively low pin counts (e.g., the pins of a QFN are typically located along the die edge).

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level. Compared to flat no-lead (QFN) packaging techniques, wafer-level packaging is generally less costly to implement since packaging occurs at wafer level, while flat no-lead packaging is performed at strip level. Moreover, the footprint of a comparable wafer-level packaged device is typically less than that of a QFN packaged device since wafer-level packages can be nearly equal to the size of the integrated circuit chip.

Accordingly, techniques are described that employ wafer-level packaging techniques to fabricate semiconductor devices that have form factors similar to those of devices that employ flat no-lead (QFN) packaging technologies. The wafer-level package devices may thus provide mechanical protection of the integrated circuit chips (dies) contained within the device packages that is similar to that provided by flat no-lead (QFN) devices, while maintaining the benefits inherent in wafer-level packaging (e.g., lower cost, smaller package size, high pin count, etc.). The wafer-level package devices include an integrated circuit chip (e.g., a die) having pillars that provide electrical interconnectivity to the devices. In specific implementations, the pillars may be copper pillars having a solder layer formed over the exposed end of the pillar. An encapsulation structure configured to support the pillar is formed over the surface of the integrated circuit chip at wafer level. In embodiments, the encapsulation structure may be fabricated from epoxy, or a like substance. In one or more implementations, a second integrated circuit device may be mounted to the integrated circuit chip so that the integrated circuit device is in electrical communication with the integrated circuit chip. The second integrated circuit device is at least partially encapsulated by the encapsulation structure. Once singulated from the wafer, the devices may be mounted to a printed circuit board, and the pillars provide electrical interconnectivity through the backside of the device that interface with the pads of the printed circuit board.

Example Implementations

Figure 2A:
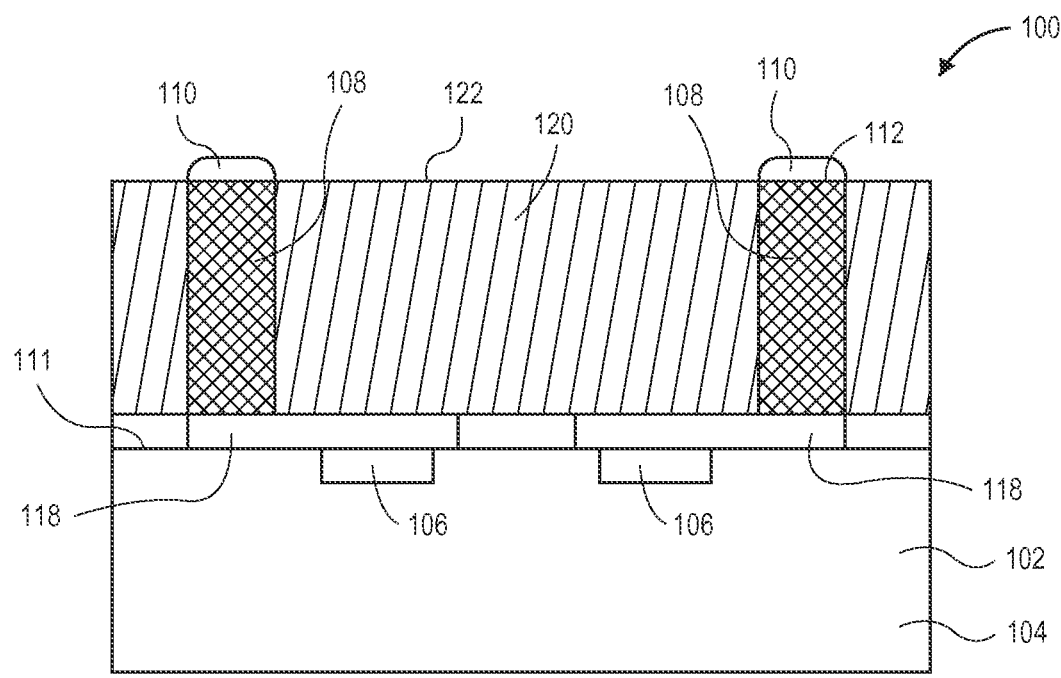
FIG. 2A is a diagrammatic partial-cross-sectional side elevation view of the section of the wafer-level package device as shown in FIG. 1 taken along plane 2A-2A.
Figure 2B:
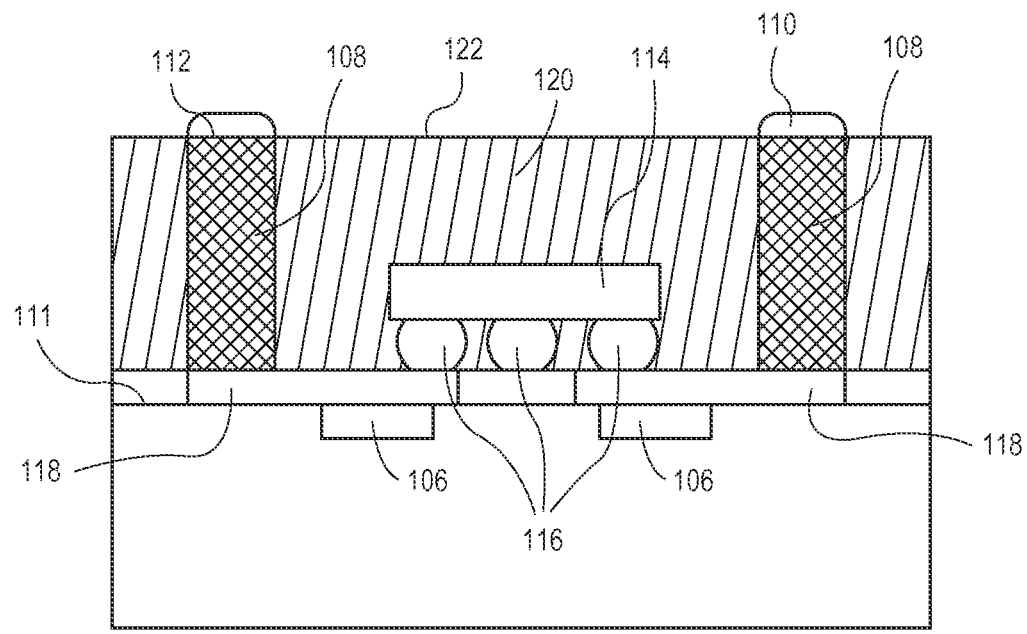
FIG. 2B is a diagrammatic partial-cross-sectional side elevation view of the section of the wafer-level package device as shown in FIG. 1 taken along plane 2B-2B, wherein the wafer-level package device includes an integrated circuit device.

FIGS. 1 through 2B illustrate semiconductor package devices 100 in accordance with example implementations of the present disclosure. In some implementations, the semiconductor package devices 100 may comprise wafer-level integrated circuit package devices. As shown, the devices 100 include an integrated circuit chip 102 comprised of a semiconductor substrate 104 having one or more integrated circuits 106 formed therein. In various implementations, the integrated circuits 106 may comprise digital integrated circuits, analog integrated circuits, mixed signal integrated circuits, combinations thereof, and so forth. The integrated circuits 106 may be formed through suitable front-end-of-line (FEOL) fabrication techniques.

The device 100 further includes pillars 108 extending from a surface 111 of the semiconductor substrate 104. In an implementation, the pillars 108 are copper pillars fabricated via suitable manufacturing processes, such as the dual lamination/deposition process described herein. The pillars 108 may have an aspect ratio (ratio of the width of the pillar to the height of the pillar) ranging from about one to one (1:1) to about twenty to one (20:1). In a specific example, the aspect ratio may range from about five to one (5:1) to about fifteen to one (15:1). The pillars 108 serve to provide electrical interconnections between the integrated circuit chip 102 and a printed circuit board that is configured to receive the device 100. As shown in FIGS. 2A and 2B, the pillars 108 include a solder layer 110 disposed over the exposed end 112 (e.g., the end distal from the substrate 104) to serve as a connection between the device 100 (e.g., the pillars 108) and corresponding pads disposed over the printed circuit board. In implementations, the solder layer 110 may be fabricated of a lead-free solder composition such as a Tin-Silver-Copper (Sn—Ag—Cu) alloy solder (i.e., SAC), a Tin-Silver (Sn—Ag) alloy solder, a Tin-Copper (Sn—Cu) allow solder, and so on.

In some implementations, the device 100 may include a second integrated circuit device 114 (e.g., an integrated circuit package device) disposed over (and mounted to) the surface 111 of the integrated circuit chip 102. In embodiments, the second integrated circuit device 114 may be in electrical communication with the integrated circuits 106 of the integrated circuit chip 102. For instance, as shown in FIG. 2B, the integrated circuit device 114 includes solder bumps 116 that allow the device 114 to be in electrical contact with the device 100. The solder bumps 116 may, for example, be positioned over a redistribution structure, such as a redistribution layer (RDL) 118, of the wafer-level chip-scale device 100 to allow electrical communication between the device 114 and the device 100 (e.g., the integrated circuits 106, etc.). The RDL 118 may be formed from a conductive material, such as polysilicon, aluminum, copper, and so on. Thus, the integrated circuit device 114 extends additional functionality to the device 100 by enabling system-in-a-package capabilities. In implementations, the integrated circuit device 114 may be a digital integrated circuit device, an analog integrated circuit device, a mixed-signal integrated circuit device, and so forth. As with the solder layer 110 described above, the solder bumps 116 may be fabricated of a lead-free solder composition such as a Tin-Silver-Copper (Sn—Ag—Cu) alloy solder (i.e., SAC), a Tin-Silver (Sn—Ag) alloy solder, a Tin-Copper (Sn—Cu) allow solder, and so on. However, it is contemplated that Tin-Lead (PbSn) solder compositions may be used.

The device 100 also includes an encapsulation structure 120 disposed over the surface 111 of the integrated circuit chip 102. As shown in FIGS. 2A and 2B, the encapsulation structure 120 at least substantially encapsulates the pillars 108. Thus, the encapsulation structure 120 provides support and insulation to the pillars 108 (and the integrated circuit device 114 when the device 100 employs an integrated circuit device 114). The pillars 108 have a length that at least substantially extends to the depth of the encapsulation structure 120. As shown in FIGS. 1 through 2B, the solder layer 110 extends beyond a plane defined by the surface 122 of the encapsulation structure 120 to allow the solder layer 110 to connect to the corresponding pads of the printed circuit board. In an implementation, the encapsulation structure 120 may be a polymer material, such as epoxy, or the like, deposited over the surface 111 of the waferl-level chip-scale package device 100.

Example Fabrication Processes

Figure 3:
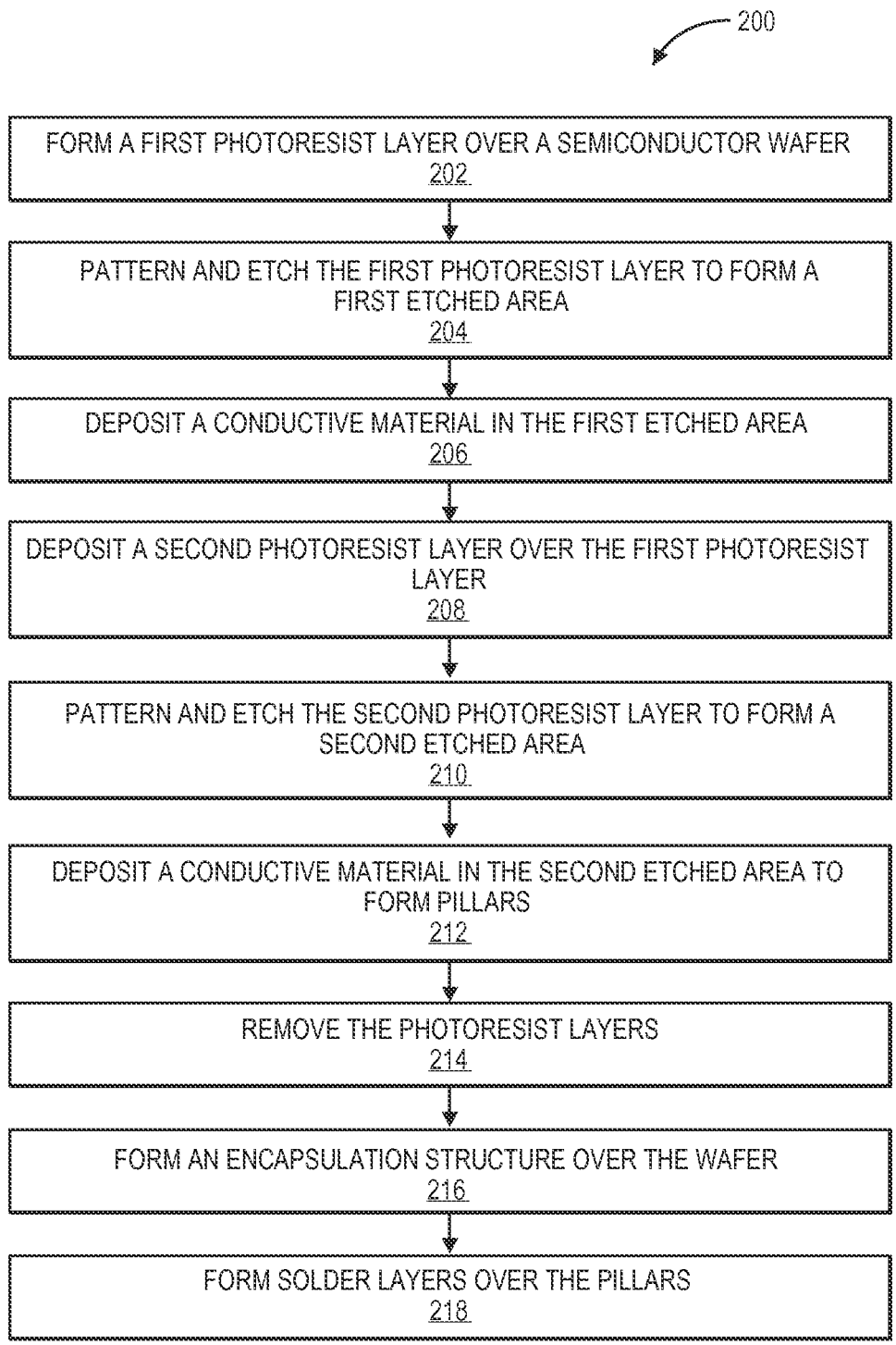
FIG. 3 is a flow diagram illustrating a process in an example implementation for fabricating wafer-level package devices, such as the devices shown in FIGS. 1 through 2A.
Figure 4A:
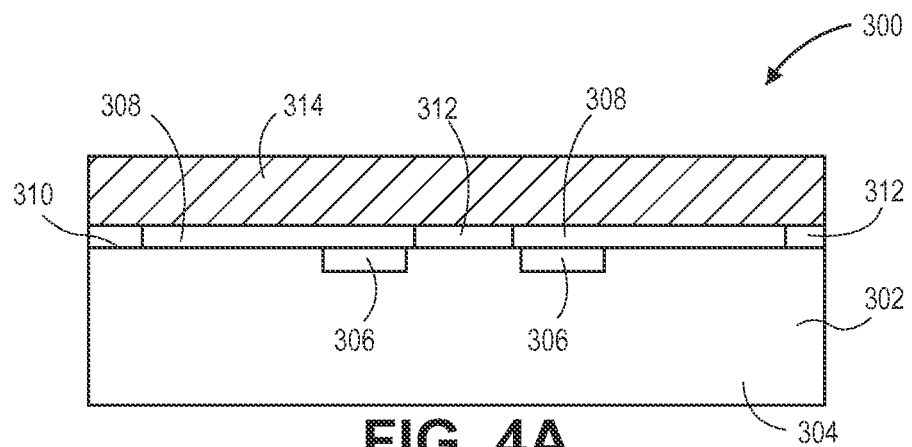
FIGS. 4A through 4I are diagrammatic partial cross-sectional side elevation views illustrating the fabrication of a wafer-level package device, such as the device shown in FIGS. 1 and 2A, in accordance with the process shown in FIG. 3.

FIG. 3 illustrates an example process 200 that employs wafer-level packaging techniques to fabricate semiconductor devices having pillars, such as the devices 100 shown in FIGS. 1 and 2A. In the process 200 illustrated, one or more pillars are initially formed over a semiconductor wafer. As described herein, a dual lamination/deposition process may be employed to form the pillars. Accordingly, a first photoresist layer is formed over a semiconductor wafer (Block 202) prior to segmentation of the wafer into individual circuit chips (die). FIG. 4A illustrates a portion of the wafer 300, which, when processed through suitable FEOL fabrication techniques, includes a semiconductor substrate 302 that comprises an integrated circuit chip 304. The integrated circuit chip 304 includes one or more integrated circuits 306 formed therein. The substrate 302 may include a redistribution structure, such as a redistribution layer (RDL) 308, formed over the surface 310 of the substrate 302. As shown, a dielectric layer 312 may also be formed over the surface 310 of the substrate 302. The dielectric layer 312 may be benzocyclobutene polymer (BCB), silicon dioxide ($SiO_2$), or the like. The first lamination step includes applying a first photoresist layer 314 over the wafer 300 (e.g., over the RDL 308 and the dielectric layer 312). The first photoresist layer 314 may be a composition of photopolymer and polyester film that may be patterned and etched through one or more suitable dry film lamination processes.

Figure 4B:
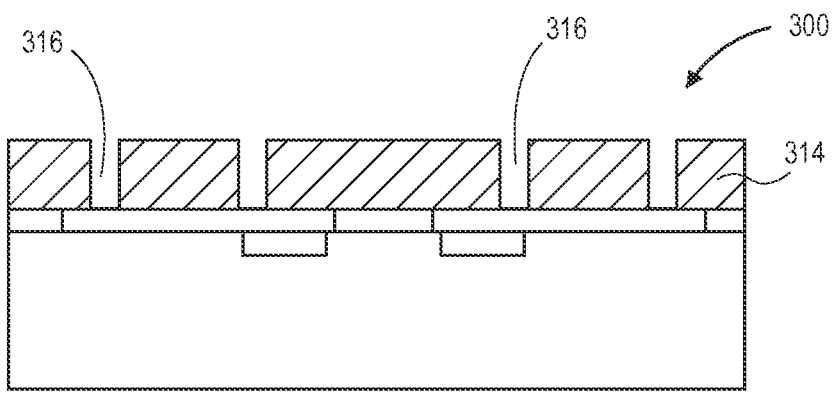

The first photoresist layer is then patterned and etched to form a first etched area (Block 204). FIG. 4B illustrates the first photoresist layer 314 which is shown patterned and etched to form first etched areas 316. The etched areas 316 extend at least through the first photoresist layer 314 to pads of the RDL layer 308.

Figure 4C:
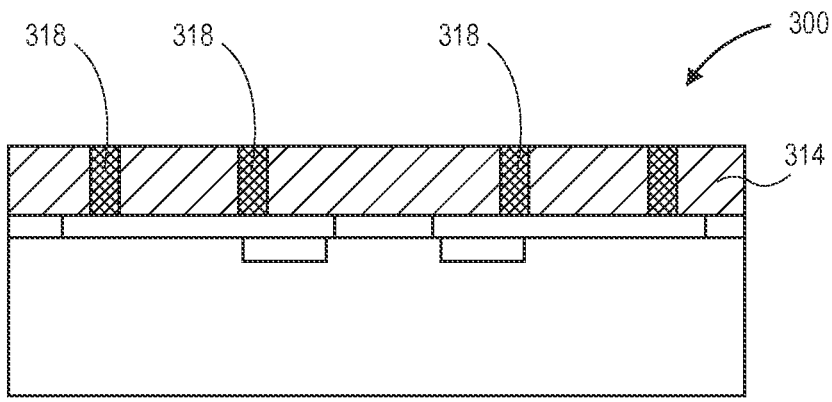

A conductive material is then deposited in the first etched area (Block 206). FIG. 4C illustrates the conductive material 318 deposited in the etched areas 316 of the wafer 300. In one or more implementations, a suitable electroplating process may be utilized to deposit a conductive material 318 in the etched areas 316 of the photoresist layer 314. The conductive material 318 may comprise copper, aluminum, or a like conducting metal, or other conducting material.

Figure 4D:
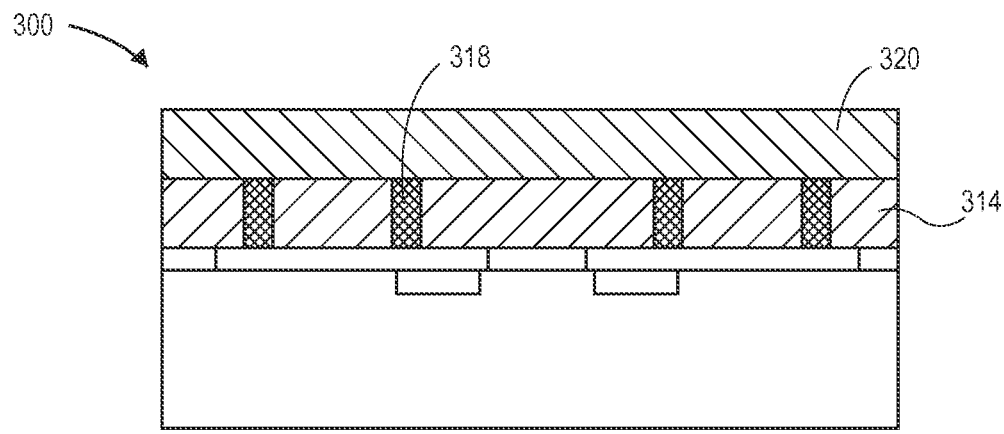
Figure 4E:
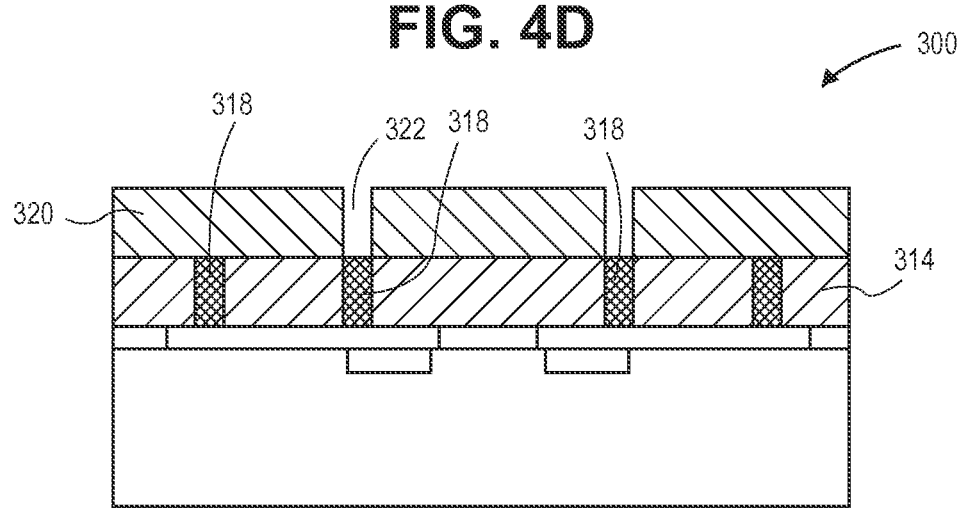

A second photoresist layer is then applied over the remaining first photoresist layer (Block 208) and the conductive material. FIG. 4D illustrates the second photoresist layer 320 deposited over the remaining first photoresist layer 314 and the conductive material 318. Once deposited, the second photoresist layer is patterned and etched to form a second etched area (Block 210). FIG. 4E illustrates the second photoresist layer 320 wherein the second photoresist layer 320 has been patterned and etched to form one or more second etched areas 322 positioned over the previously etched areas (e.g., first etched areas 316). The etched areas 322 extend the depth of the second photoresist layer 320 so that the conductive material 318 is at least partially exposed.

Figure 4F:
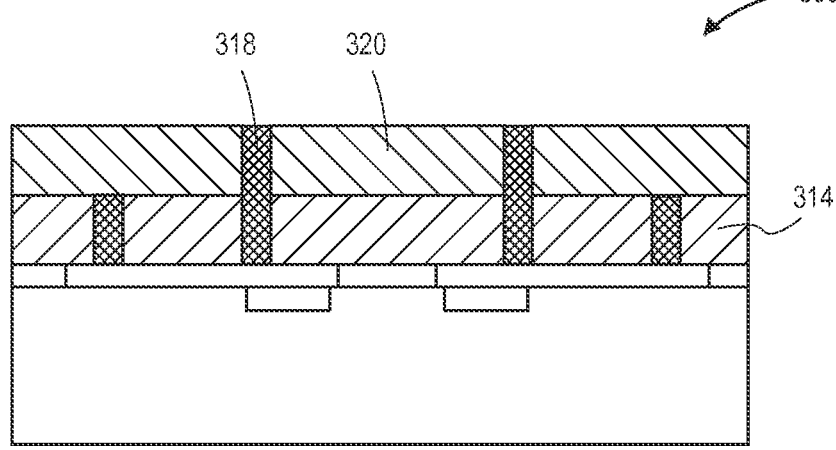

A conductive material is then deposited in the second etched area to complete formation of one or more pillars (Block 212). FIG. 4F illustrates conductive material 318 deposited in the etched areas 322 to form pillars 324. As shown, the conductive material 318 deposited in etched areas 322 is at least partially in contact with the conductive material 318 deposited in the etched areas 316. In one or more implementations, the conductive material 318 (e.g., copper, etc.) is electroplated in the etched areas 322 to form pillars 324 (e.g., copper pillars).

Figure 4G:
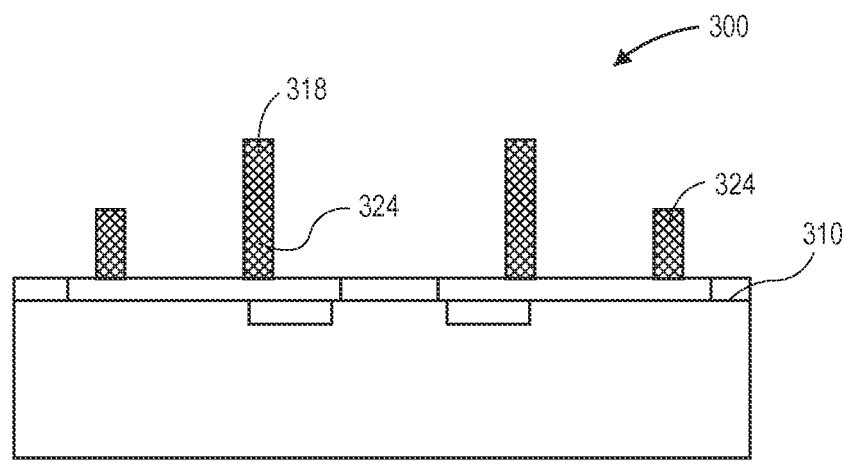

Once the pillars have been formed, the photoresist layers are removed (Block 214). FIG. 4G illustrates removal of the first and second photoresist layers 314, 320 (see FIG. 4F) through suitable stripping processes. In addition, the pillars 324 may be subjected to a suitable seed etch process. As described above, an integrated circuit chip device (shown in FIG. 2B) may be positioned over the substrate 302. An integrated circuit chip device may extend system-in-a-package capabilities to the integrated circuit chip 304.

Figure 4H:
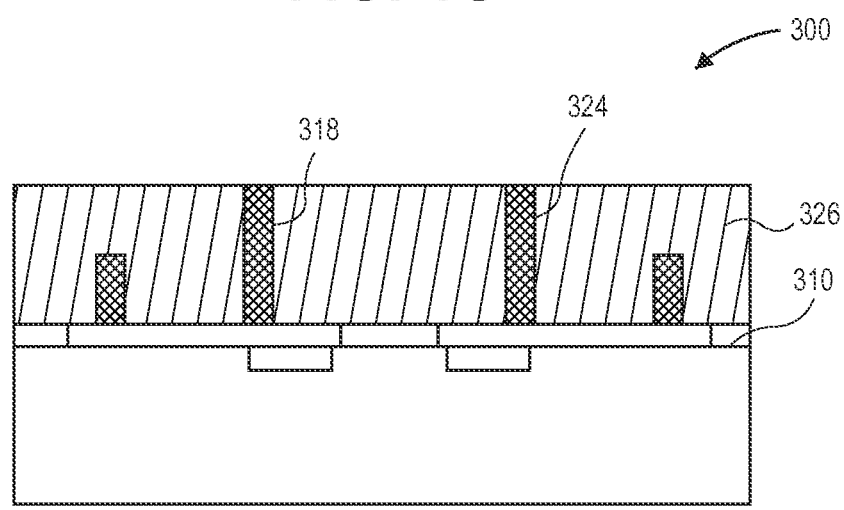
Figure 4I:
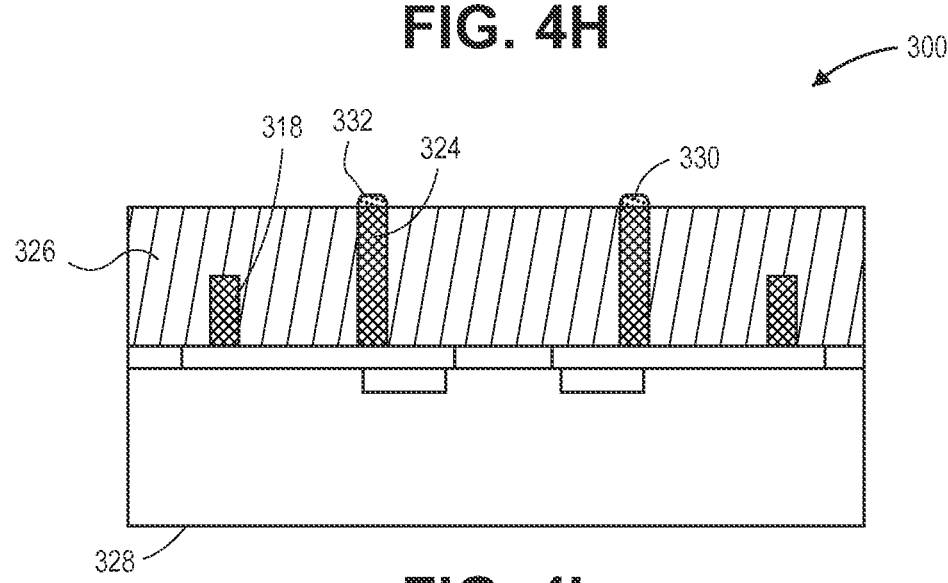

Once the pillars are formed, an encapsulation structure is formed over the wafer to at least substantially encapsulate the pillars (Block 216). FIG. 4H illustrates the encapsulation structure 326 formed over the surface 310 of the wafer 300 to provide support and insulation to the integrated circuits 306 and the pillars 324. In embodiments, multiple polymer layers (e.g., epoxy, etc.) may be deposited over the surface 310 to form the encapsulation structure 326. It is contemplated that an epoxy material may also be deposited on the backside (e.g., over the surface 328) of the wafer 300. Once formed, the encapsulation structure 326 may be subjected to a grinding process to expose pillars 324 (e.g., expose the end of the pillar 324 distal from the substrate 302). As shown, the encapsulation structure 326 extends at least substantially the length (e.g., depth or height) of the pillars 324. As shown in FIG. 4H, in an implementation, a first pillar 324 extends through at least substantially the entire encapsulation structure 326 (e.g., extends at least substantially the height of the encapsulation structure 326, the height of the first pillar 324 is same as height of the encapsulation structure 326) and a second pillar 324 extends through only partially through the encapsulation structure 326. For example, the second pillar 324 may only extend halfway through the encapsulation structure 326 (e.g., the height of the second pillar 324 is at least approximately half the height of the encapsulation structure 326). However, it is understood that other pillar heights may be utilized according to the requirements of the wafer-level semiconductor package devices.

A solder layer is then applied to the pillar. (Block 218). For example, solder layers 330 (e.g., a solder finish) may be formed over (e.g., applied to) the exposed ends 332 of the pillars 324 (e.g., the ends of the pillars 324 distal to the wafer 300). In an implementation, the wafer 300 may be subjected to a suitable dip-soldering process to apply the solder layers 330 over the exposed copper pillar leads. Once the dip-soldering process is complete, suitable processes may be employed to segment the individual integrated circuit chips 304 into individual packages.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer-level package device comprising:
   an integrated circuit chip having a surface;
   a plurality of pillars extending from the surface, the plurality of pillars having an end distal from the surface, the plurality of pillars configured to provide an electrical interconnection to the integrated circuit chip;
   a first photoresist layer disposed over the surface; and
   a second photoresist layer disposed over the first photoresist layer,
   wherein a first pillar of the plurality of pillars extends through the first photoresist layer and the second photoresist layer and a second pillar of the plurality of pillars extends only through the first photoresist layer.

2. The wafer-level package device as recited in claim 1, wherein the plurality of pillars comprise copper pillars.

3. The wafer-level package device as recited in claim 1, wherein the aspect ratio of the plurality of pillars ranges from at least approximately one to one (1:1) to at least approximately twenty to one (20:1).

4. The wafer-level package device as recited in claim 1, wherein the aspect ratio of the plurality of pillars ranges from at least approximately five to one (5:1) to at least approximately fifteen to one (15:1).

5. A semiconductor device comprising:
   an integrated circuit chip having a surface;
   a plurality of pillars extending from the surface, the plurality of pillars having an end distal from the surface, the plurality of pillars configured to provide an electrical interconnection to the integrated circuit chip;
   a first photoresist layer disposed over the surface; and
   a second photoresist layer disposed over the first photoresist layer,
   wherein a first pillar of the plurality of pillars extends through the first photoresist layer and the second photoresist layer and a second pillar of the plurality of pillars extends only through the first photoresist layer,
   wherein the aspect ratio of the plurality of pillars ranges from at least approximately one to one (1:1) to at least approximately twenty to one (20:1).

6. The semiconductor device as recited in claim 5, wherein the plurality of pillars comprise copper pillars.

7. The semiconductor device as recited in claim 5, wherein the aspect ratio of the plurality of pillars from at least approximately five to one (5:1) to at least approximately fifteen to one (15:1).

* * * * *